(12) United States Patent
Shimomura et al.

(10) Patent No.: US 12,713,650 B2
(45) Date of Patent: Aug. 18, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Akihiro Shimomura, Tokyo (JP); Masami Sawada, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 607 days.

(21) Appl. No.: 18/189,541

(22) Filed: Mar. 24, 2023

(65) Prior Publication Data

US 2023/0411512 A1 Dec. 21, 2023

(30) Foreign Application Priority Data

May 31, 2022 (JP) ................................ 2022-088676

(51) Int. Cl.
*H10D 30/66* (2025.01)
*H10D 30/01* (2025.01)

(52) U.S. Cl.
CPC ....... *H10D 30/668* (2025.01); *H10D 30/0297* (2025.01)

(58) Field of Classification Search
CPC ............. H10D 30/668; H10D 30/0297; H10D 30/0295; H10D 30/665; H10D 30/025; H10D 30/63; H10D 64/256; H10D 62/111; H10D 62/124; H10D 64/513
See application file for complete search history.

(56) References Cited

U.S. PATENT DOCUMENTS 7,291,884 B2 * 11/2007 Darwish .............. H10D 62/393 257/E29.066
7,335,949 B2 2/2008 Ninomiya et al.
2006/0244054 A1 * 11/2006 Kobayashi ........... H10D 30/668 257/E29.066

(Continued)

FOREIGN PATENT DOCUMENTS

JP 2006-196518 A 7/2006
JP 2007-027193 A 2/2007
JP 2021-057552 A 4/2021

OTHER PUBLICATIONS

Notice of Reasons for Refusal issued in corresponding Japanese Patent Application No. 2022-088676, dated Sep. 2, 2025.

*Primary Examiner* — Galina G Yushina
(74) *Attorney, Agent, or Firm* — RIMON P.C.

(57) ABSTRACT

An improved structure and a manufacturing method of a vertical type power MOSFET having a super junction configuration is disclosed. The improved structure and the manufacturing method of the vertical type power MOSFET comprising: a step of preparing a semiconductor substrate SB including an n-type semiconductor layer SL and a p-type epitaxial layer EP on the semiconductor layer SL; a step of forming a trench GT in the p-type epitaxial layer EP by using an etching mask with a predetermined opening width; and a step of introducing an n-type impurity into a bottom portion of the trench GT using the etching mask with the predetermined opening width, whereby forming an n-type column NC at the bottom of trench GT and reaching the semiconductor layer SL.

3 Claims, 18 Drawing Sheets

(56) References Cited

U.S. PATENT DOCUMENTS

| | | | | |
|---|---|---|---|---|
| 2007/0013000 | A1* | 1/2007 | Shiraishi | H10D 30/0295<br>257/E29.066 |
| 2015/0270385 | A1* | 9/2015 | Shimomura | H10D 30/668<br>257/334 |
| 2016/0005811 | A1* | 1/2016 | Weber | H10D 62/103<br>257/329 |
| 2016/0351658 | A1* | 12/2016 | Hébert | H10D 62/159 |
| 2021/0104625 | A1* | 4/2021 | Sato | H10D 62/107 |

* cited by examiner

PER
CR
PR1
IF3
IF2
IF1
EP
SL
SB
GT
GT

PER
CR
PR1
IF3
IF2
IF1
EP
SL
SB
GT
GT
NC
NC

FIG. 4

PER
CR
GT
GT
EP
SL
SB
NC
NC

FIG. 5

PER
CR
IF4
GT
GE
GT
GE
EP
SL
SB
NC
NC

FIG. 6

PER
CR
PR3
IF4
GT
GE
SR
SR
EP
SL
SB
BR
NC
NC
BR

PER
CR
IL
IF4
GT
GE
SR
EP
SL
SB
BR
NC
NC
BC
BR

FIG. 11

PER
CR
IL
IF4
GT
GE
SR
EP
SL
SB
BR
NC
NC
BC
BR

FIG. 16

PER
CR
IF5
IF6
PR4
GT
GE
SR
EN
SL
SB
BR
IF4
NC
PC
NC
BR
PC

PER
CR
GM
CP
IL
CV
GT
GE
SR
SM
EN
SL
SB
BR
IF4
NC
PC
BC

FIG. 19

COMPARATIVE EXAMPLE

CR
PER
SM
SR
CP
GE
GT
CV
IL
CP
GM
PC
BR
BC
PC
IF4
BR
SL
EN
SB

SEMICONDUCTOR DEVICE AND METHOD OF MANUFACTURING THE SAME

CROSS-REFERENCE TO RELATED APPLICATIONS

The disclosure of Japanese Patent Application No. 2022-088676 filed on May 31, 2022, including the specification, drawings and abstract is incorporated herein by reference in its entirety.

BACKGROUND

The present invention relates to a semiconductor device and a method of manufacturing the same, and more particularly, to a technique that is effective when applied to a power semiconductor device.

In a vertical power MOSFET that is a power semiconductor device, in order to maintain a breakdown voltage and suppress ON resistance, it has been studied to adopt a super junction structure in which n-type columns and p-type columns are alternately arranged.

For example, Japanese unexamined Patent Application publication JP-A-2006-196518 discloses a semiconductor device employing the super junction structure having p-type columns that are formed in a semiconductor substrate between a plurality of trenches in which gate electrodes are buried, and discloses that the p-type columns are formed by an ion implantation method.

SUMMARY

When a p-type column is formed using a photolithography technique and an ion implantation method, a trench (gate trench) formed by a photolithography technique and a dry etching method and a p-type column may approach each other due to misalignment of lithography. It is also conceivable that impurities in the p-type column diffuse excessively in the lateral direction. In these cases, the width of the n-type semiconductor region, which is a current path, is narrowed, and the ON resistance of the semiconductor element is increased, resulting in a decrease in the performance of the semiconductor device.

Other objects and novel features will become apparent from the description of this specification and the accompanying drawings.

The typical ones of the embodiments disclosed in the present application will be briefly described as follows.

In a manufacturing method of a semiconductor device according to an embodiment, in a manufacturing process of a vertical power MOSFET having a super junction structure, the manufacturing method includes a step of forming a gate trench in an upper surface of a semiconductor substrate including an n-type semiconductor layer and a p-type semiconductor layer on the n-type semiconductor layer by an etching method using a mask, and a step of forming an n-type column reaching the n-type semiconductor layer by introducing an n-type impurity into a bottom portion of the gate trench using the mask, after the step of forming the gate trench.

A semiconductor device according to an embodiment includes a vertical power MOSFET having a super junction structure, the vertical power MOSFET includes a gate trench in which a gate electrode is buried and wherein the gate trench is formed on an upper surface of a semiconductor substrate including an n-type semiconductor layer and a p-type semiconductor layer on the n-type semiconductor layer, the vertical power MOSFET further includes an n-type column formed directly under the gate trench and adjacent to the p-type semiconductor layer and in contact with the n-type semiconductor layer.

According to the embodiments disclosed in the present application, performance of a semiconductor device can be improved.

BRIEF DESCRIPTION OF THE DRAWINGS

FIG. 4 is a cross-sectional view during the manufacturing process of the semiconductor device following FIG. 3.

FIG. 5 is a cross-sectional view during the manufacturing process of the semiconductor device following FIG. 4.

FIG. 6 is a cross-sectional view during the manufacturing process of the semiconductor device following FIG. 5.

FIG. 8 is a cross-sectional view during the manufacturing process of the semiconductor device following FIG. 7.

FIG. 9 is a cross-sectional view during the manufacturing process of the semiconductor device following FIG. 8.

FIG. 10 is a cross-sectional view during the manufacturing process of the semiconductor device following FIG. 9.

FIG. 11 is a cross-sectional view during the manufacturing process of the semiconductor device following FIG. 10.

FIG. 16 is a cross-sectional view during the manufacturing process of the semiconductor device following FIG. 15.

FIG. 19 is a cross-sectional view showing a main part of the semiconductor device of a comparative example.

DETAILED DESCRIPTION

Figure 1:
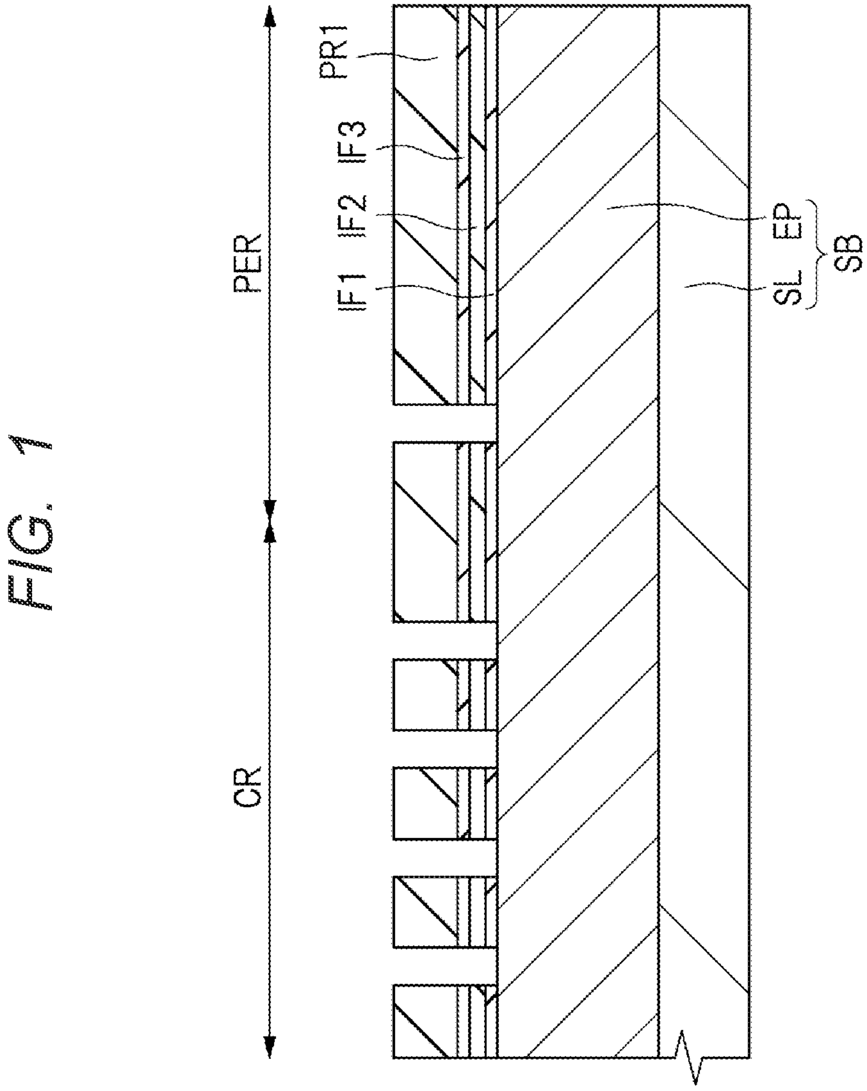
FIG. 1 is a cross-sectional view of a semiconductor device according to a first embodiment during a manufacturing process.

In the following embodiments, when required for convenience, the description will be made by dividing into a plurality of sections or embodiments. But except when specifically stated, they are not independent of each other, and one is a part of the other, or all of the other modifications, or is related to details or supplementary description. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Hereinafter, a method of manufacturing a semiconductor device according to the present embodiment will be described with reference to FIGS. 1 to 12. FIG. 1 to FIG. 12 are cross-sectional views during a manufacturing process of the semiconductor device according to the present embodiment. The semiconductor device of the present embodiment is a vertical power MOSFET (Metal Oxide Semiconductor Field Effect Transistor). MOSFET is a type of MISFET (Metal Insulator Semiconductor Field Effect Transistor).

First, as shown in FIG. 1, a semiconductor substrate (a semiconductor wafer) SB having an $n^+$ type semiconductor layer SL and an epitaxial layer EP made of a p-type semiconductor layer on a main surface (an upper surface) thereof is prepared, that is, the semiconductor substrate (a semiconductor wafer) SB having a stacked structure is prepared. That is, the epitaxial layer EP includes the semiconductor layer SL, which is an $n^+$ type semiconductor region, on the bottom surface thereof. The semiconductor substrate (a stacked semiconductor substrate) SB including the epitaxial layer EP and the semiconductor layer SL has a plurality of chip regions which are diced later to form a semiconductor chip. In a plan view, there is a cell region CR in which elements are formed at the center of the respective chip regions. The outer periphery in the chip regions is the peripheral region PER. In FIG. 1, the cell region CR is shown from the central to the left side of the drawing, and the peripheral region PER is shown on the right side of the drawing.

The semiconductor layer SL is formed by introducing an n-type impurity such as P (phosphorus) into a single-crystal silicon.

A resistor of semiconductor layer SL is, for example, 1.5 mΩcm or less. The n-type impurity concentration of the semiconductor layer SL is, for example, $5.2\times10^{19}$ $cm^{-3}$. The epitaxial layer EP is formed on the semiconductive layer SL by an epitaxial growth method. The epitaxial layer EP is mainly made of Si(Silicon). In the epitaxial layer EP, p-type impurities (for example, B (boron)) are introduced during an epitaxial growth. The p-type impurity concentration of the epitaxial layers EP is, for example, $2.5\times10^{18}$ $cm^{-3}$.

Subsequently, insulating films IF1, IF2 and a IF3 are sequentially formed on the epitaxial-layer EP (on the semiconductor substrate (the stacked semiconductor substrate)) The insulating film IF1 is made of, for example, silicon oxide, and can be formed by, for example, an oxidation method. The insulating film IF2 is made of, for example, silicon nitride, and can be formed by, for example, CVD (Chemical Vapor Deposition) method. The insulating film IF3 is made of, for example, silicon oxide, and can be formed by, for example, CVD method.

Subsequently, a photoresist film PR1 is formed on the insulating film IF3. The photoresist film PR1 is a resist pattern having openings exposing the insulating film IF3 in each of the cell region CR and the peripheral region PER. In the cell region CR, the openings are arranged in a plan view. Subsequently, a dry etching is performed by using the photoresist film PR1 as a mask (an etching preventing mask or an etching mask). Thus, parts of the insulating film IF1, IF2 and IF3 are removed to expose the upper surface of the epitaxial layers.

Figure 2:
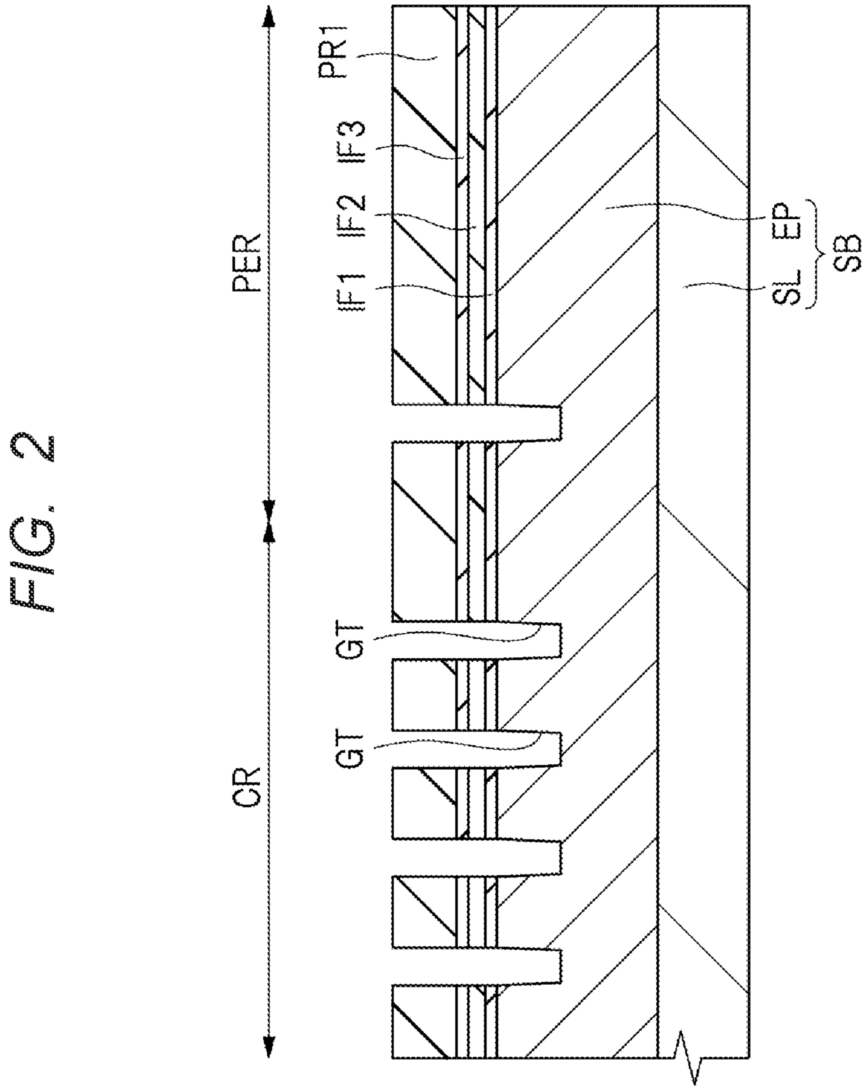
FIG. 2 is a cross-sectional view during the manufacturing process of the semiconductor device following FIG. 1.

Next, as shown in FIG. 2, a dry etching is performed using the photoresist film PR1, the insulating films IF1, IF2, and IF3 as masks. As a result, a plurality of trenches GT reaching the intermediate depth of the epitaxial layer EP are formed from the upper surface of the epitaxial layer EP. In the cell region CR, the plurality of trenches GT having a predetermined width and a predetermined depth extend in Y direction along the upper surface of the semiconductor layer SL and the upper surface of the semiconductor substrate SB, and are arranged in X direction perpendicular to the Y direction in a plan view. However, the trenches GT may be formed in an island shape in plan view and arranged in a plurality of staggered rows. The trenches GT reach a depth in the middle of the epitaxial layer EP and does not reach the interface between the epitaxial layer EP and the semiconducting layer SL. The distance between the trench GT and the semiconductor layer SL in a direction (vertical direction, vertical direction, and thickness direction) perpendicular to the upper surface of the epitaxial layer EP is, for example, 2 micrometers or less. The trench GT is a gate trench in which a gate electrode is embedded in a subsequent process.

Here, the use of the photoresist film PR1 as an etch mask in the step of forming the trench GT has been described. However, after the process described with reference to FIG. 1, the photoresist film PR1 may be removed prior to the etching. In the etching, only the insulating film IF1, IF2 and IF3 are used as masks (hard masks).

Figure 3:
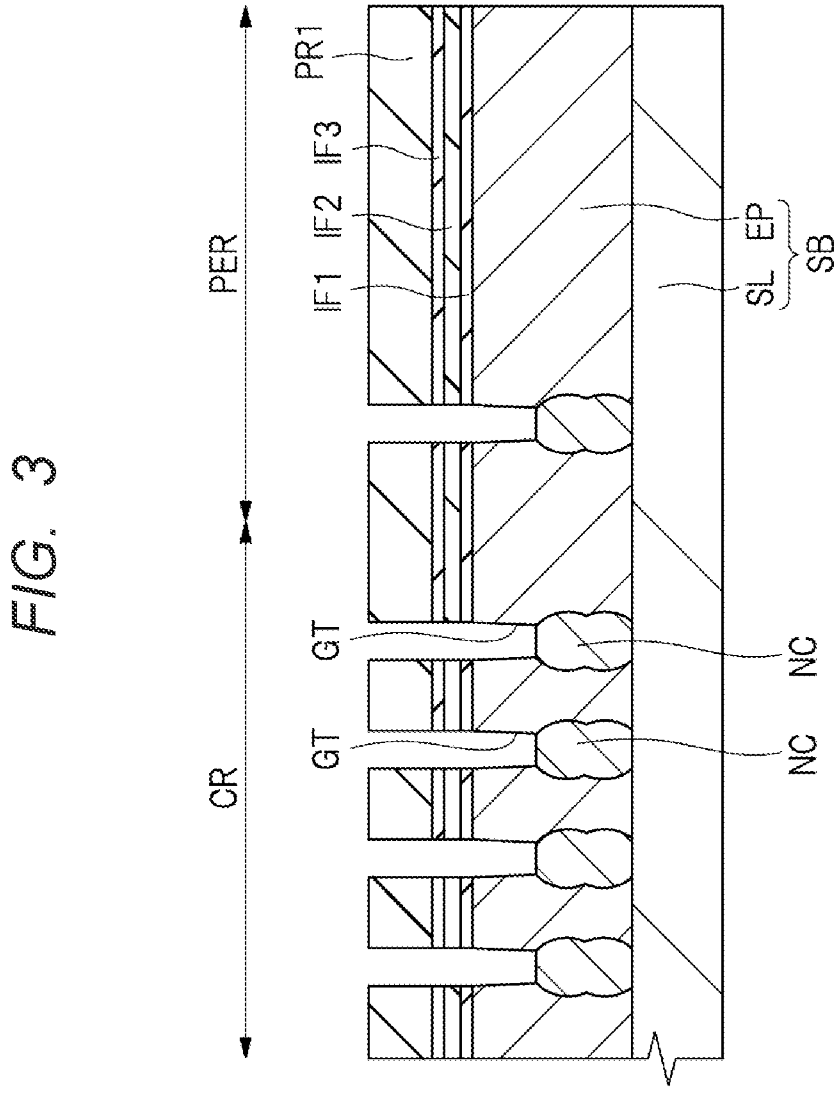
FIG. 3 is a cross-sectional view during the manufacturing process of the semiconductor device following FIG. 2.

Next, as shown in FIG. 3, an ion implantation is performed using the photoresist film PR1, the insulating films IF1, IF2, and IF3 as masks (an ion implantation blocking mask, an impurity introduction mask). That is, an n-type impurity (e.g., P (phosphorus)) is introduced into the epitaxial layers EP on the bottom surface of the trench GT. Here, n-type impurities are implanted into the epitaxial layers EP directly under the trench GT twice with differing implantation energies. That is, the multi-stage injection is performed. By introducing the n-type impurities into the epitaxial layer EP in this manner, the epitaxial layer EP directly under the respective trenches GT is formed with an n-type column NC. The dose of this implantation step is, for example, $5.0\times10^{13}$~$5.0\times10^{14}$ $cm^{-2}$. For example, the first injection is 1.5 MeV and the second injection is 2.0 MeV. The vertical length of the n-type column NC is, for example, about 2 micrometers. The n-type impurity density of the n-type column NC is, for example, $1.0\times10^{19}$ $cm^{-3}$.

The n-type columns NC directly under each of the trench GT adjacent to each other are spaced apart from each other via the p-type epitaxial layers EP. The n-type columns NC adjoin the epitaxial layer EP along the upper surface of the epitaxial layer EP. A part (a bottom part) of the n-type column NC is in contact with the semiconductor layer SL of the $n^+$ type semiconductor region. One of the main features of the present embodiment is to form the n-type column NC that reaches the semiconductor layer SL of by introducing the n-type impurity into the trench GT by using a mask used in forming the trench GT. In other words, an impurity introduction in the step of forming the n-type column NC is performed by an ion implantation using a mask (etching mask) that defines the opening of the trench GT as a mask for impurity introduction.

In case of the photoresist film PR1 has been removed in the process described with reference to FIG. 2, ion implantation for forming the n-type column NC is performed by using the insulating film IF1, IF2 and IF3 as masks (ion implantation blocking masks).

Figure 4:
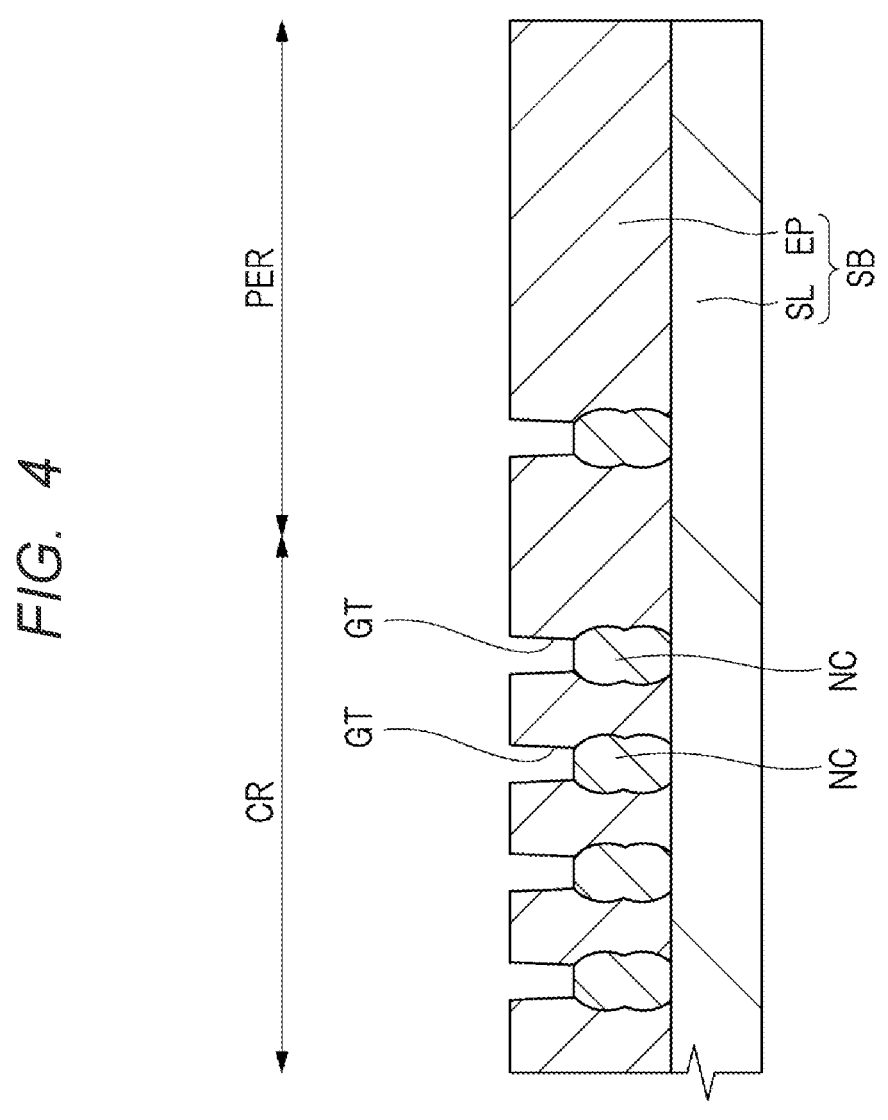

Next, as shown in FIG. 4, the photoresist film PR1, the insulating films IF1, IF2, and IF3 on the epitaxial layer EP are removed.

Figure 5:
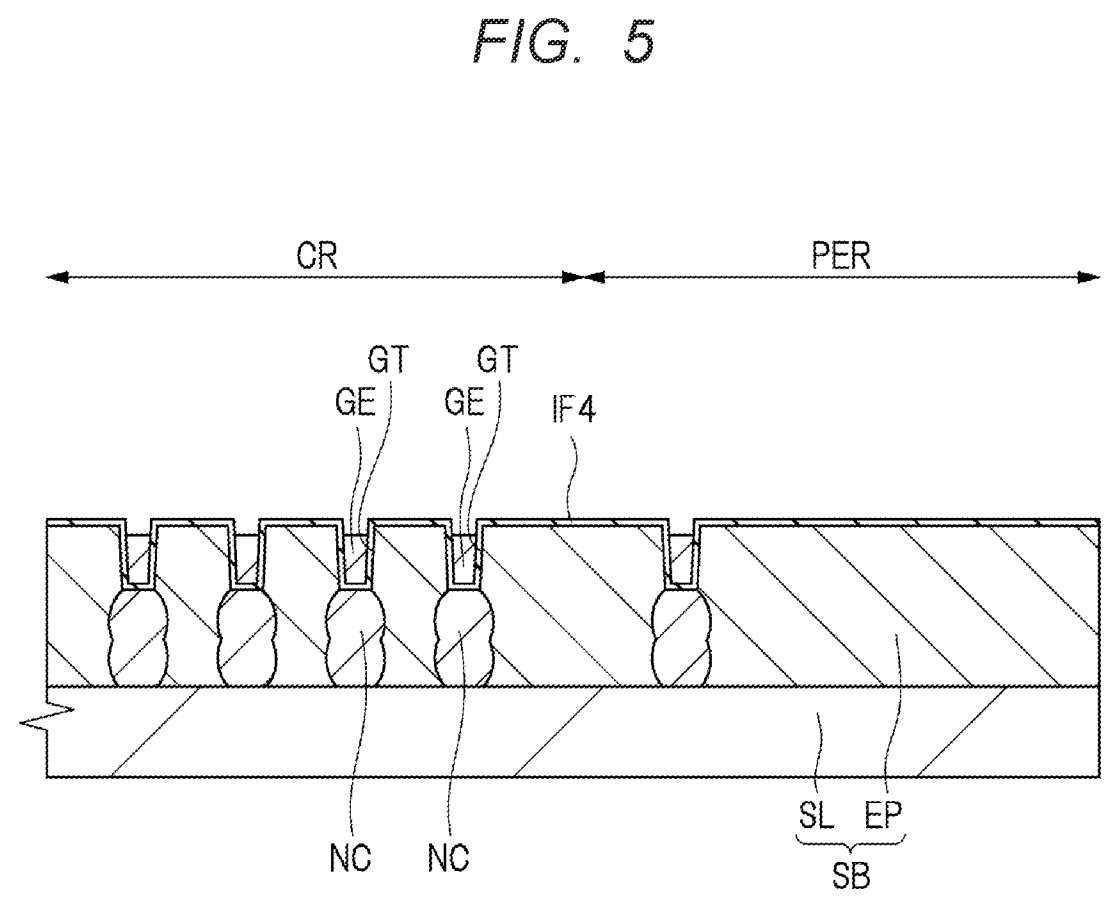

Next, as shown in FIG. 5, a silicon oxide film covering of a side surface and a bottom surface in the trench GT, and an upper surface of the epitaxial layers EP outside the trench GT is formed by, for example, an oxidation method. Subsequently, a silicon film is formed on the silicon oxide film by using, for example, a CVD method, and thereby the inside of the trench GT is completely buried. Subsequently, for example, etching back is performed to remove a part of the silicon film on the upper surface of the epitaxial layer EP except in the trench GT. Thus, a gate electrode GE made of the silicon film is formed in the trench GT via the insulating film (gate insulating film) IF4 made of the silicon oxide film.

Figure 6:
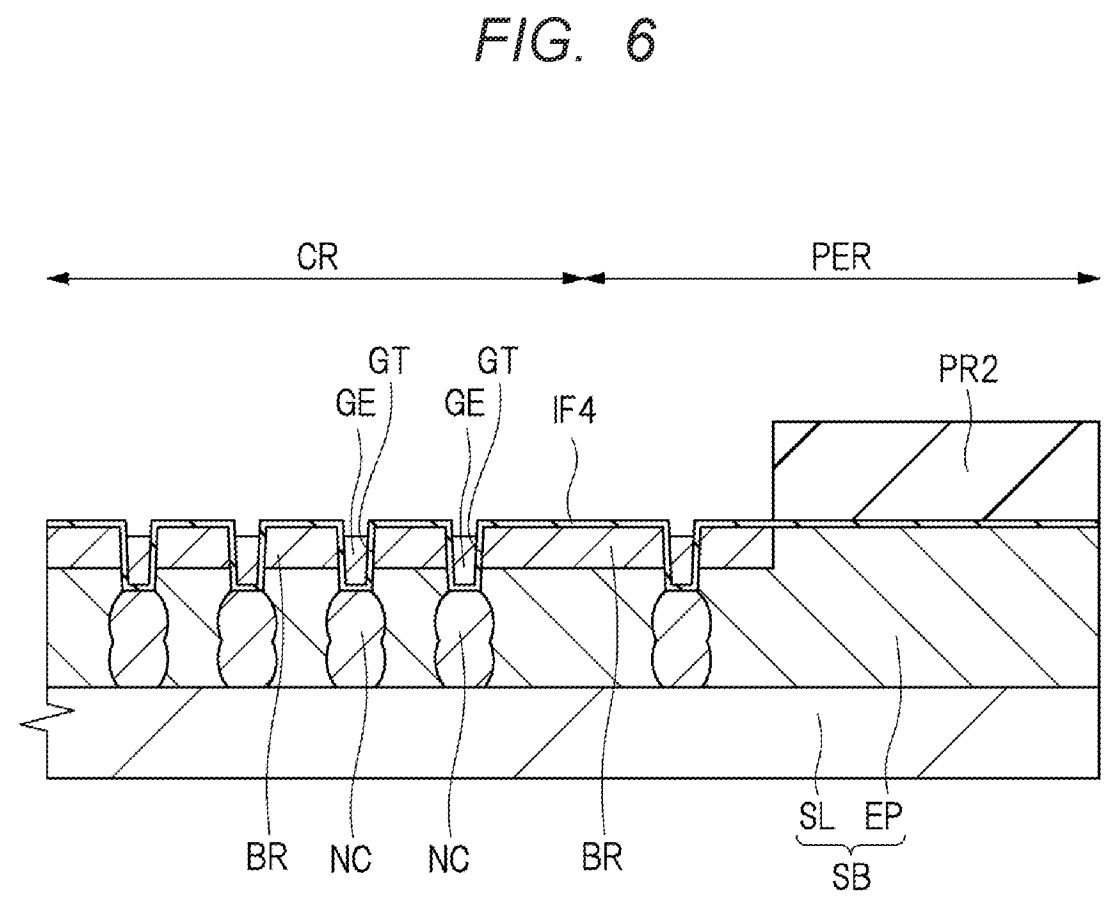

Next, as shown in FIG. 6, a photoresist film PR2 is formed on the epitaxial layers EP. The photoresist film PR2 is a resist pattern including an opening that exposes an upper surface of the epitaxial layers EP of regions adjoining the trench GT of the cell region CR and the peripheral region PER. Subsequently, ion-implantation is performed using the photoresist film PR2 as a mask, and a p-type impurity (for example, B (boron)) is implanted on the upper surface of the epitaxial layer EP. By introducing p-type impurities into the epitaxial layers EP in this manner, a p-type body region BR shallower than the trench GT is formed between adjacent trenches. The body region BR is in contact with the side surface of the trench GT and is formed along the side surface. The depth of the body region BR is shallower than the depth of the gate electrode GE.

The body regions BR are formed by, for example, three times of ion-implantation (multi-stage implantation) with different implantation energies. The dose of the respective implantation step is, for example, $3.3\times10^{12}$ $cm^{-2}$. The p-type impurity concentration of the body region BR is, for example, $1.0\times10^{18}$ $cm^{-3}$.

Figure 7:
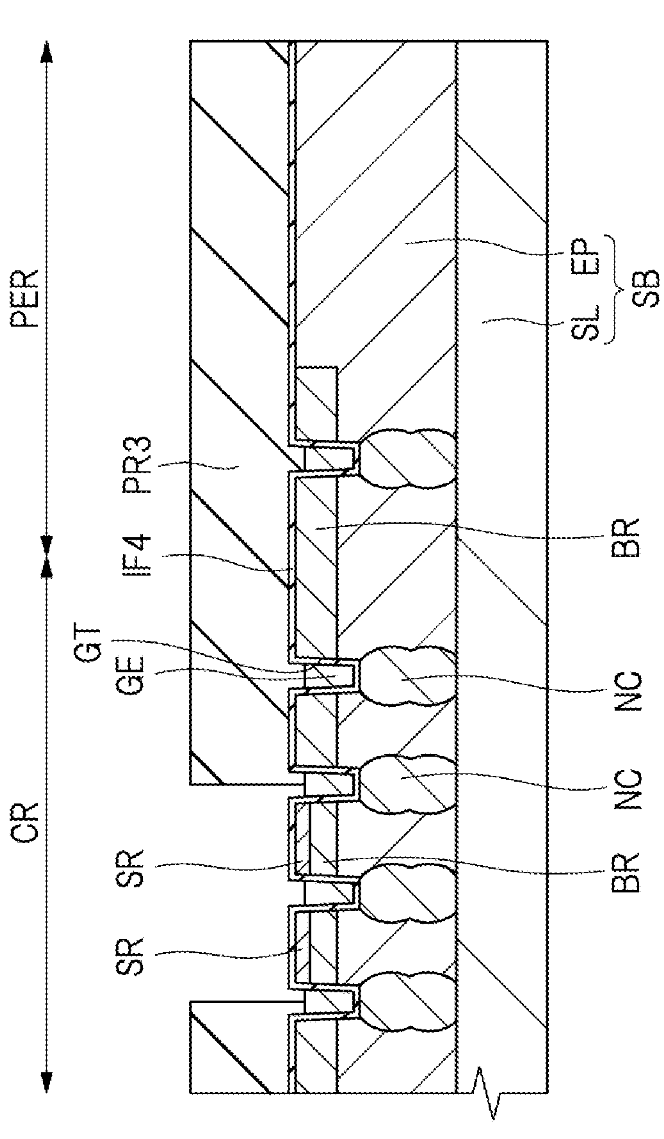
FIG. 7 is a cross-sectional view during the manufacturing process of the semiconductor device following FIG. 6.

Next, as shown in FIG. 7, the photoresist film PR2 is removed. Thereafter, a photoresist film PR3 is formed on the epitaxial layers EP. The photoresist film PR3 is a resist pattern including an opening that exposes an upper surface of the epitaxial layers EP in a region adjoining the trench GT of the cell region CR. Subsequently, ion implantation is performed using the photoresist-film PR3 as a mask, and an n-type impurity (for example, As (arsenic)) is implanted on the upper surface of the epitaxial-layer EP. By introducing n-type impurities into the epitaxial layers EP in this manner, a $n^+$ type source region SR shallower than the body-region BR is formed between adjacent trench GT. The source region SR is in contact with the side surface of the trench GT and the body region BR, and is formed along the side surface.

The dose of this implantation step is, for example, $1.0\times10^{16}$ $cm^{-2}$. The n-type impurity density of the source-region SR is, for example, $1.0\times10^{21}$ $cm^{-3}$.

Figure 8:
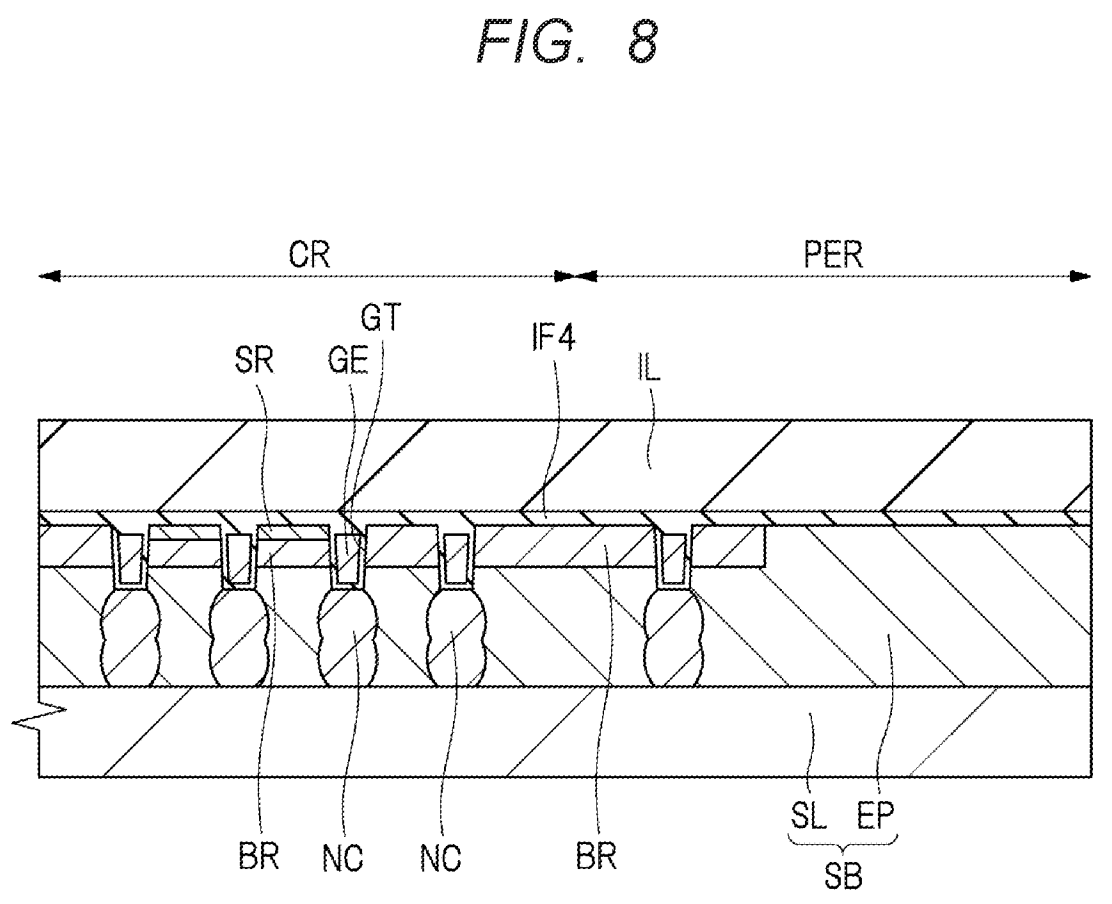

Next, as shown in FIG. 8, the photoresist film PR3 is removed. Thereafter, an insulating film is formed on each of the epitaxial layer EP, the insulating film IF4, and the gate-electrode GE using, for example, a CVD method. The insulating film is made of, for example, silicon oxide. In FIG. 8, the insulating film and the insulating film IF4 are integrally formed, and they are collectively shown as the insulating film IF4.

Subsequently, an interlayer insulating film IL is formed on the insulating film IF4. The interlayer insulating film IL is mainly made of, for example, silicon oxide, and can be formed by, for example, a CVD method. Subsequently, the upper surface of the interlayer insulating film IL is polished to be planarized by using, for example, CMP (Chemical Mechanical Polishing) method. Subsequently, although not shown, an insulating film made of silicon oxide is formed on the interlayer insulating film IL by, for example, a CVD method.

Figure 9:
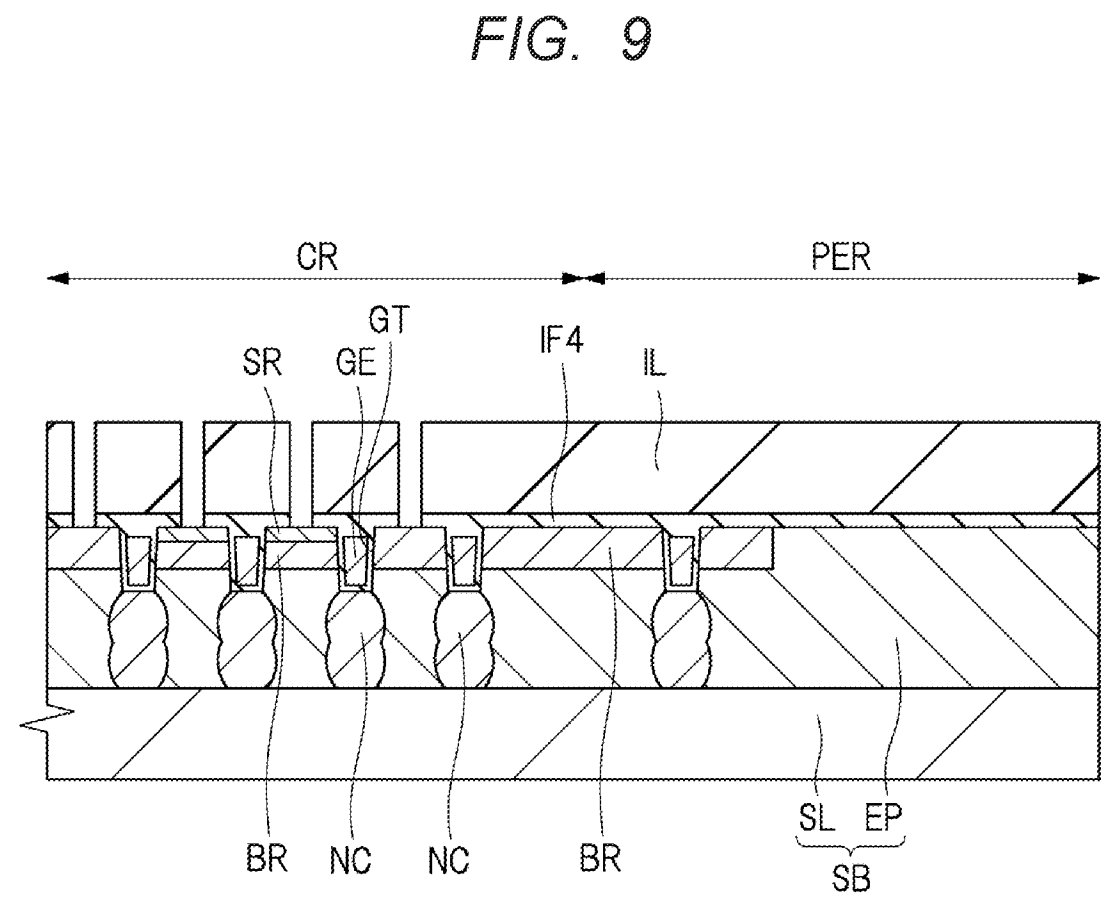

Next, as shown in FIG. 9, the interlayer insulating film IL is patterned using a photolithography technique and a dry etching method. As a result, a connecting hole (opening) that penetrates the interlayer insulating film IL and exposes the upper surface of the epitaxial layer EP in which the source region SR is formed in the cell region CR is formed.

Figure 10:
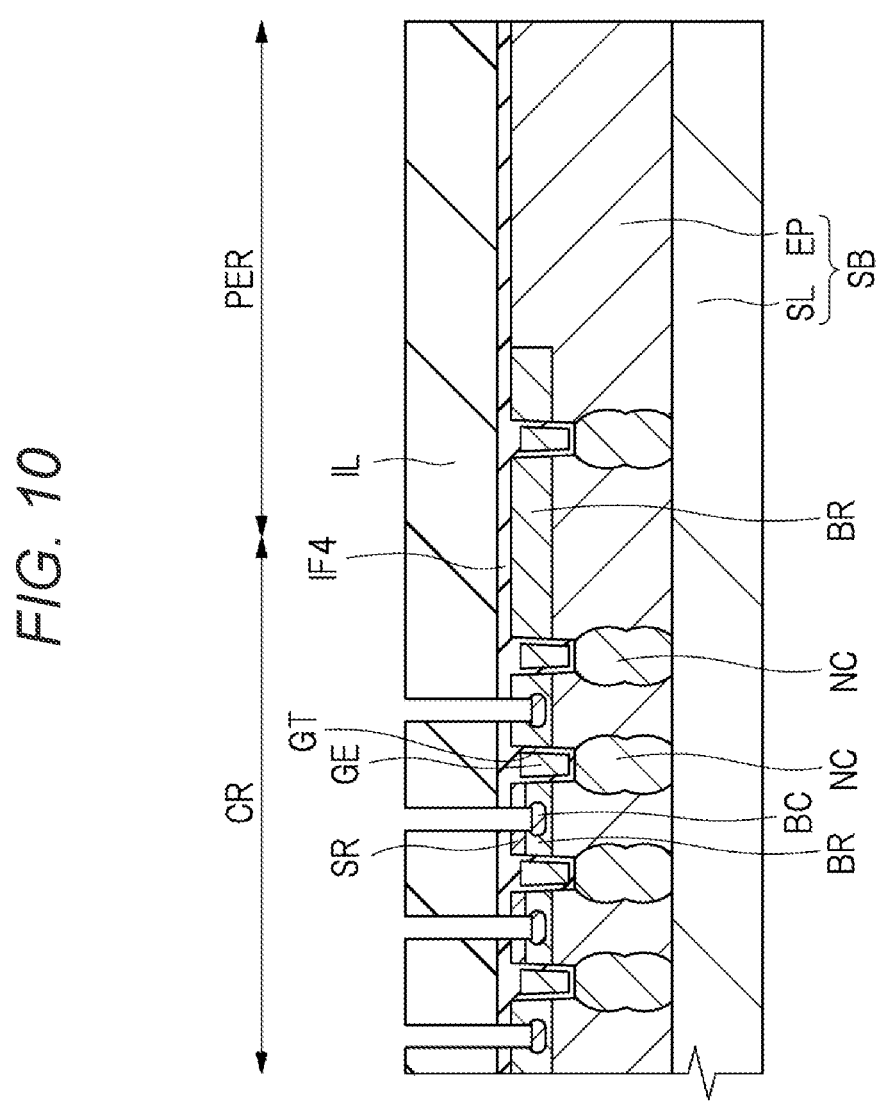

Next, as shown in FIG. 10, the upper surface of the epitaxial layer EP exposed at the bottom of each of the plurality of connecting holes is retracted by etching using the interlayer insulating film IL as a mask. Accordingly, a plurality of trenches deeper than the source region SR and shallower than the body region BR are formed. A body region BR is exposed on a bottom surface of the trench.

Subsequently, ion-implantation is performed using the interlayer insulating film IL as a mask. Here, p-type impurities (e.g., $BF_2$ (boron fluoride)) are implanted into the epitaxial layers EP directly under each of the plurality of connecting holes in the cell region CR. By introducing the p-type impurity into the epitaxial layer EP in this manner, $P^+$ type diffused region BC is formed at a position spaced apart from the trench GT from the upper surface of the body region BR over the middle depth of the body region BR. Thereafter, the semiconductor wafer is subjected to a heat treatment. By this heat treatment, the impurities in the source region SR and the diffusion region BC are diffused.

As described above, in the cell region CR, a supper junction structure having the n-type column NC and the p-type epitaxial layers EP alternately arranged laterally. That is, the epitaxial layers EP between the n-type column NC adjacent to each other constitute a p-type column. The gate electrode GE, the source region SR, the body-region BR, the n-type column NC, the epitaxial-layer EP, and $n^+$ type semiconductor region of the semiconductor layer SL constitute a vertical-type power MOSFET. The structure formed in the peripheral region PER is a structure for securing the breakdown voltage of the outer periphery of the semiconductor chip.

Figure 11:
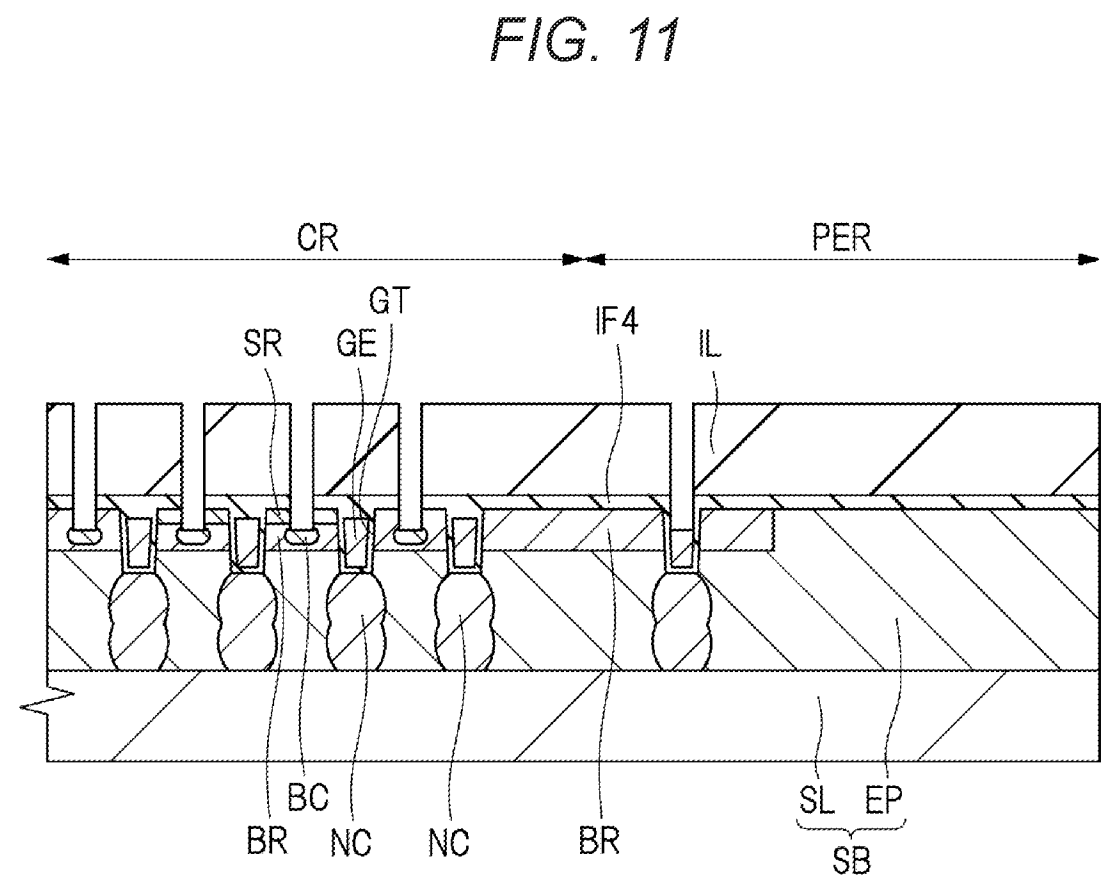

Next, as shown in FIG. 11, the interlayer insulating film IL is patterned using a photolithography technique and a dry etching method. As a result, a connecting hole (opening) that penetrates the interlayer insulating film IL and exposes the upper surface of the gate-electrode GE in the peripheral region PER is formed.

Figure 12:
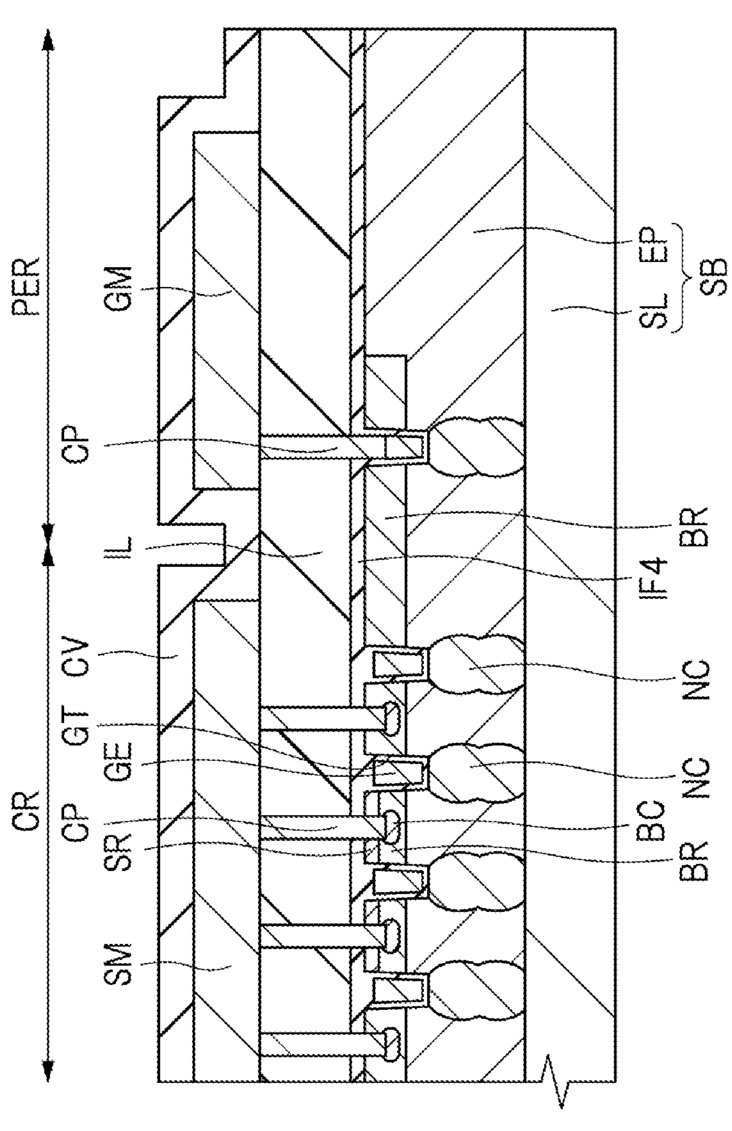
FIG. 12 is a cross-sectional view during the manufacturing process of the semiconductor device following FIG. 11.

Next, as shown in FIG. 12, a metallic film is formed on the interlayer insulating film IL. That is, for example, a TiN (titanium nitride) film, a Ti (titanium) film, and a W (tungsten) film are sequentially formed by a sputtering method or the like. As a result, the inside of each connection hole is buried by the metal films. Subsequently, the upper surface of the interlayer insulating film IL is exposed by removing the metallic films on the interlayer insulating film IL by, for example, a CMP method. As a result, a contact plug (conductive connection portion) CP formed of the metallic films remaining in the connection holes is formed. In FIG. 12, the metallic films constituting the contact plug CP are collectively shown as one contact plug CP.

Subsequently, a metallic film made of Al (aluminum) is formed on the interlayer insulating film IL and the contact plug CP by a sputtering method or the like. Subsequently, the metal film is patterned using a photolithography technique and a dry etching method to form a source electrode SM and a gate extraction electrode GM formed of the metal film. Here, the gate extraction electrode GM is formed in the peripheral region PER. The source electrode SM of the cell region CR is electrically connected to the source region SR and the diffused region BC via the contact plug CP. The gate extraction electrode GM is electrically connected to the gate electrode GE via the contact plug CP.

Subsequently, a surface-protective film CV is formed so as to cover the source-electrode SM and the gate-extraction electrode GM. That is, a silicon-oxide film is deposited on each of the source-electrode SM and the gate-extraction electrode by, for example, a CVD method. Then, by patterning the silicon oxide film, the upper surface of a part of the source electrode SM and the upper surface of the gate-extraction electrode GM are exposed. The exposed portion serves as an external connection region (for example, a gate pad or a source pad). As a result, a surface-protective film CV made of the silicon-oxide film is formed.

Subsequently, a drain electrode (not shown) is formed on the back surface of the semiconductor-substrate SB. For example, the metal film is formed by a sputtering method or an evaporation method with the back surface of the semiconductor-substrate SB as an upper surface. Thus, a drain electrode made of a metal film can be formed.

Thereafter, the semiconductor wafer is cut by a dicing process, whereby each of the plurality of chip regions of the semiconductor wafer is singulated. That is, one semiconductor chip can be obtained from one chip region, and a plurality of semiconductor chips can be obtained from a semiconductor wafer. Through the above steps, the semiconductor device of the present embodiment can be formed.

Figure 13:
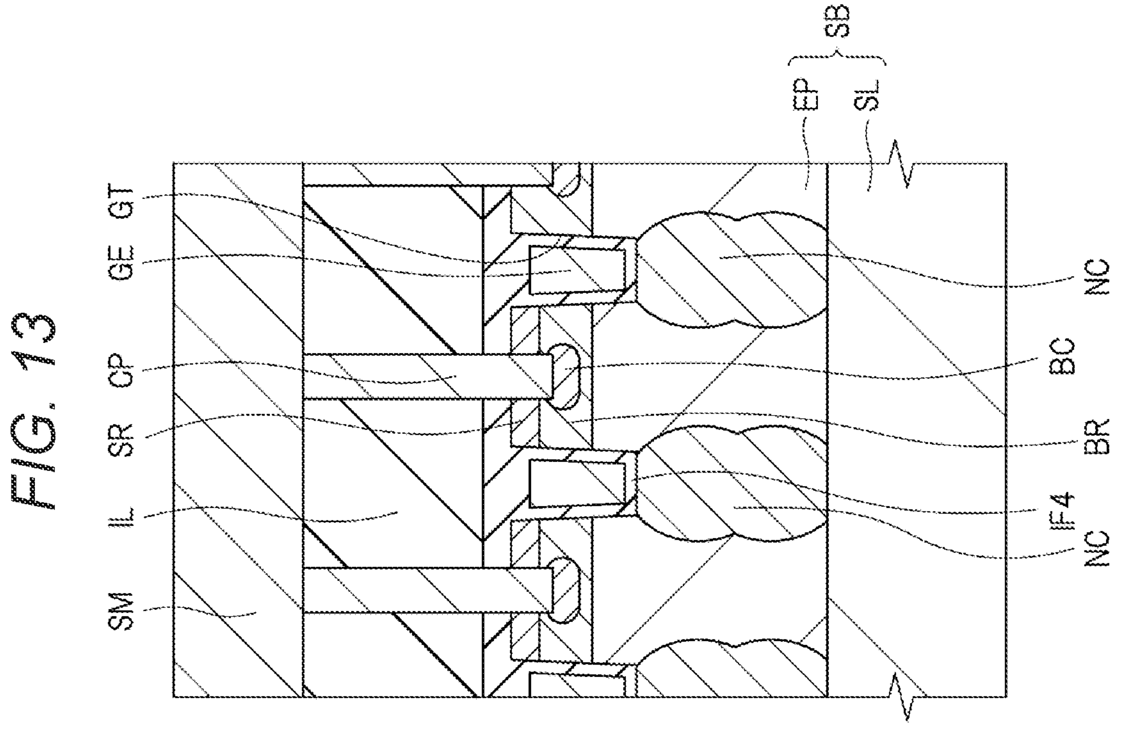
FIG. 13 is a cross-sectional view of a main part of the semiconductor device according to the first embodiment.

FIG. 13 is a cross-sectional view of a main part of a cell region of the semiconductor device of the present embodiment. As shown in FIG. 13, the semiconductor device of the present embodiment has a semiconductor substrate SB (that is, a stacked semiconductor substrate) having an $n^+$ type semiconductor layer SL and an epitaxial layer EP made of a p-type semiconductor layer on a main surface (upper surface) thereof. The bottom surface of the epitaxial layer EP is in contact with the semiconductor layer SL which is a $n^+$ type semiconductor region.

A plurality of trenches GT that reach the intermediate depth of the epitaxial layer EP are formed on the upper surface of the epitaxial layer EP. The trenches GT extend in the Y direction, for example, and are arranged in the X direction in the cell region. The X direction and the Y direction referred to in the present application are directions along the upper surface of the semiconductor layer SL and the upper surface of the epitaxial layer EP, and are directions (lateral directions) perpendicular to each other in a plan view.

A gate-electrode GE is buried in the respective trenches GT via an insulating film IF4. That is, the side surface and the bottom surface of the trench GT are covered with an insulating film IF4 made of, for example, a silicon oxide film, and the epitaxial layers EP and the gate-electrode GE are insulated from each other by the insulating film IF4. The gate electrode GE is formed of, for example, a polycrystalline silicon film.

In the epitaxial layers EP between adjacent trench GT, a body region (p-type semiconductor region) BR and a source region SR, which is a $n^+$ type diffused region in which the lower surface is in contact with the body region BR, are formed on the side surfaces of the respective trenches. In other words, in the epitaxial layer EP, a body region BR having a predetermined depth is formed from the upper surface of the epitaxial layer EP, and a source region SR is formed on the upper surface of the body region BR. Further, between the adjacent trenches GT, a diffused region BC which is a $p^+$ type semiconductor region separated from the trench GT and in contact with the body region BR is formed.

An n-type column NC, which is an n-type semiconducting region, is formed in the epitaxial layers EP immediately below the trench GT. The n-type column NC immediately below each of the trench GT adjacent to each other are spaced apart from each other via the p-type epitaxial layers EP. The n-type column NC adjoins the epitaxial layer EP along the upper surface of the epitaxial layer EP. A part (lower part) of the n-type column NC is in contact with the semiconductor layers SL which are $n^+$ type semiconductor regions.

The n-type impurity concentration of the source-region SR is higher than the n-type impurity concentration of each of the n-type column NC and the semiconductor layer SL. The p-type impurity concentration of the diffused regions BC is higher than the p-type impurity concentration of the epitaxial layer EP.

An interlayer insulating film IL is formed on the epitaxial layer EP and the gate electrode GE, and a contact plug CP penetrating the interlayer insulating film IL is connected to the source region SR and the diffusion region BC.

The body regions BR are formed between opposite side surfaces of adjacent trench GT. Further, below the body regions BR, a part of the epitaxial layers EP is formed between opposite side surfaces of adjacent trench GT.

As in the cell region CR, by arranging the vertical power MOSFET on the main surface of the structure (super junction structure) in which the n-type column NC and the p-type column (p-type epitaxial layer EP) are periodically arranged, the ON resistance can be reduced while securing a high breakdown voltage.

That is, in the super-junction structure in which the p-type column and the n-type column are periodically arranged, the depletion layer extends in the lateral direction in the n-column from the border area between the p-type column and the n-type column in the lateral direction, that is, the depletion layer extends from a PN junction extending in the vertical direction.

Therefore, in the vertical power MOSFET having the super junction structure, the breakdown voltage can be secured by the depletion layer extending laterally from pn junction even if the impurity concentration of the n-type column serving as the current path is increased in order to reduce the ON resistance. Therefore, the ON resistance can be reduced while ensuring a high breakdown voltage. As described above, by adopting the super junction structure and periodically arranging the p-type column and the n-type column, the electric field between the drain and the source can be relaxed.

In the semiconductor device of the present embodiment shown in FIG. 13, the n-type column NC is in contact with the bottom surface of the trench GT. When the vertical power MOSFET is in the on-state, an inversion layer is formed in the epitaxial layer EP and the body region BR at a position in contact with the side surface of the trench GT, so that a current flows through the n-type column NC between the source region SR and the semiconductor layer SL that is the drain region. Here, a current flows through the n-type column NC between the source and the drain of the vertical power MOSFET if an inversion layer is formed between the n-type column NC and the trench GT even if the n-type column NC and the trench GT are separated from each other via the epitaxial layer.

Figure 19:
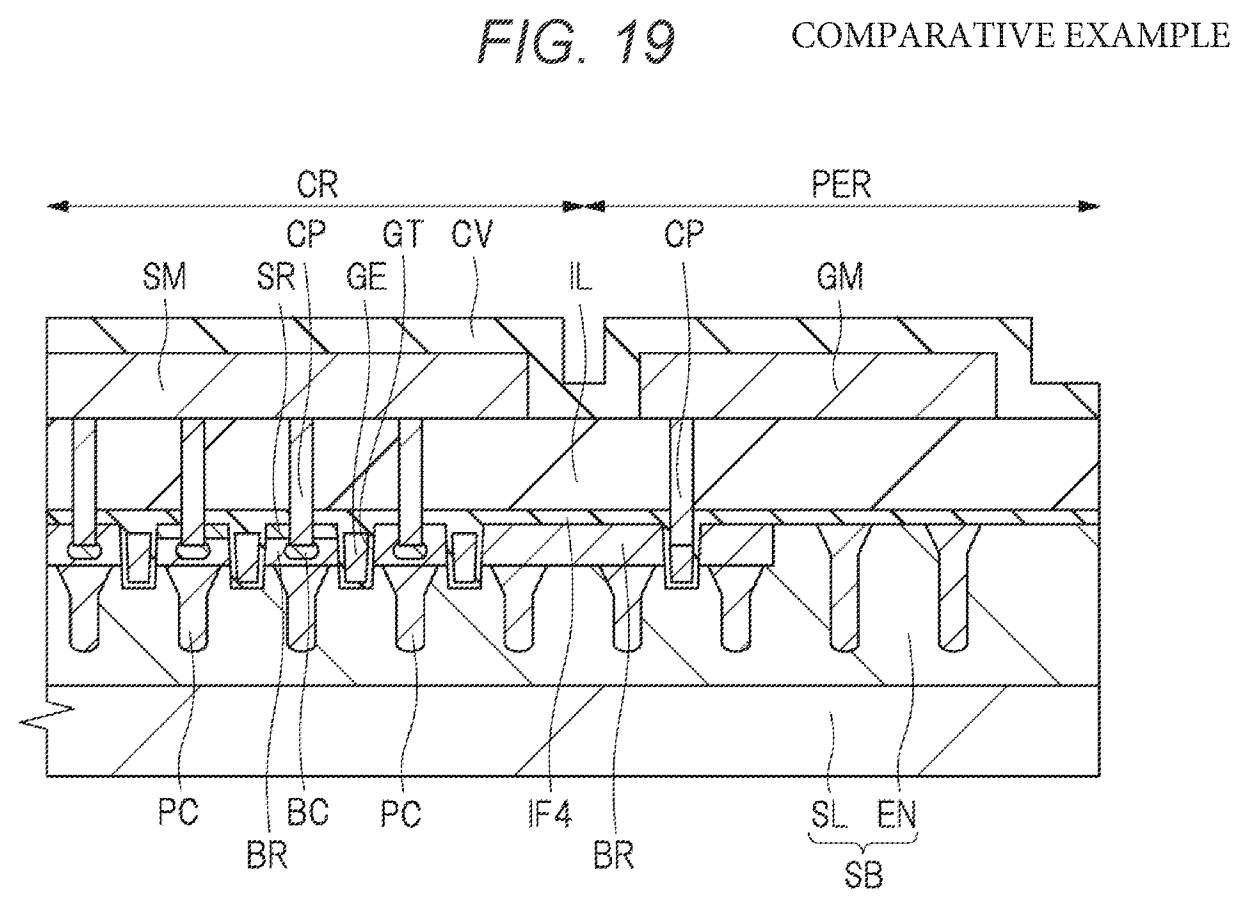

FIG. 19 is a cross-sectional view of a main part of a super junction structure that is a semiconductor device as a comparative example. In the semiconductor device of the comparative example, unlike the semiconductor device of the present embodiment, the n-type column NC is not formed, and the n-type epitaxial layer EN is formed instead of the p-type epitaxial layer EP. The semiconductor device of the comparative embodiment has a p-type column PC in the epitaxial layers EN below the regions between adjacent trench GT unlike the semiconductor device of the present embodiment. That is, the super-junction structure of the comparative example has a plurality of p-type column PC and an n-type column which is an epitaxial layer EN between adjacent p-type column PC.

In the semiconductor device of the comparative example, the trench GT is formed by a photolithography technique and a dry etching method as in the present embodiment. The p-type column PC is formed by implanting p-type impurities into the epitaxial layers EN using photolithography and ion-implantation. Here, the p-type column PC is formed by ion-implantation using a mask that differs from the mask used in forming the trench GT. In this case, there is a problem that misalignment of lithography for forming the masks may occur.

Further, it is conceivable that the p-type impurity in the p-type column PC is excessively diffused laterally by a heat treatment or the like performed after the source-region SR and the diffusion-region BC are formed.

When the above-described misalignment or excessive diffusion of the p-type impurity occurs, the trench GT and the p-type column PC may approach each other. Then, the width of the n-type column, which is the current path of the vertical power MOSFET, is narrowed. This increases the ON resistance of the vertical powered MOSFET. In addition, if there is a variation in the forming depth and the spread of the p-type column PC in the vertical direction (depth direction), the performance of the vertical power MOSFET may vary. These issues become more pronounced when the device becomes finer and the distance between the trench GT becomes smaller.

Therefore, in the present embodiment, as described with reference to FIGS. 1 to 13, an n-type column NC reaching SL of the semiconductor layers is formed directly under the trench GT by introducing an n-type impurity using a mask used when the trench GT is formed Thus, the n-type column NC is formed in a self-aligned manner with respect to the trench GT. That is, it is possible to prevent the trench GT and the n-type column NC from being displaced relative to each other. As described above, by forming the n-type column NC at a desired position, it is possible to prevent misalignment between the trench GT and the p-type column (the epitaxial layers EP). That is, the extent of the P-type column and the distance between the p-type column and the trench can be controlled.

Therefore, the occupied area of the p-type column PC can be reduced, and the resistor of the n-type column NC (drift-layer) can be reduced. Even when the size of the trench GT is reduced, the width of the n-type column NC, which is a current path, can be secured at a desired size. Therefore, it is easy to increase the number of columns arranged per unit area while securing the breakdown voltage of the vertical power MOSFET. Accordingly, the ON resistance of the vertical power MOSFET can be reduced, and the performance of the semiconductor device can be improved.

In the first embodiment, the n-type column is formed in the p-type epitaxial layer, but the p-type column and the n-type column may be formed in the n-type epitaxial layer by ion implantation. Hereinafter, a method of manufacturing the semiconductor device according to the present embodiment will be described with reference to FIGS. 14 to 17.

Figure 14:
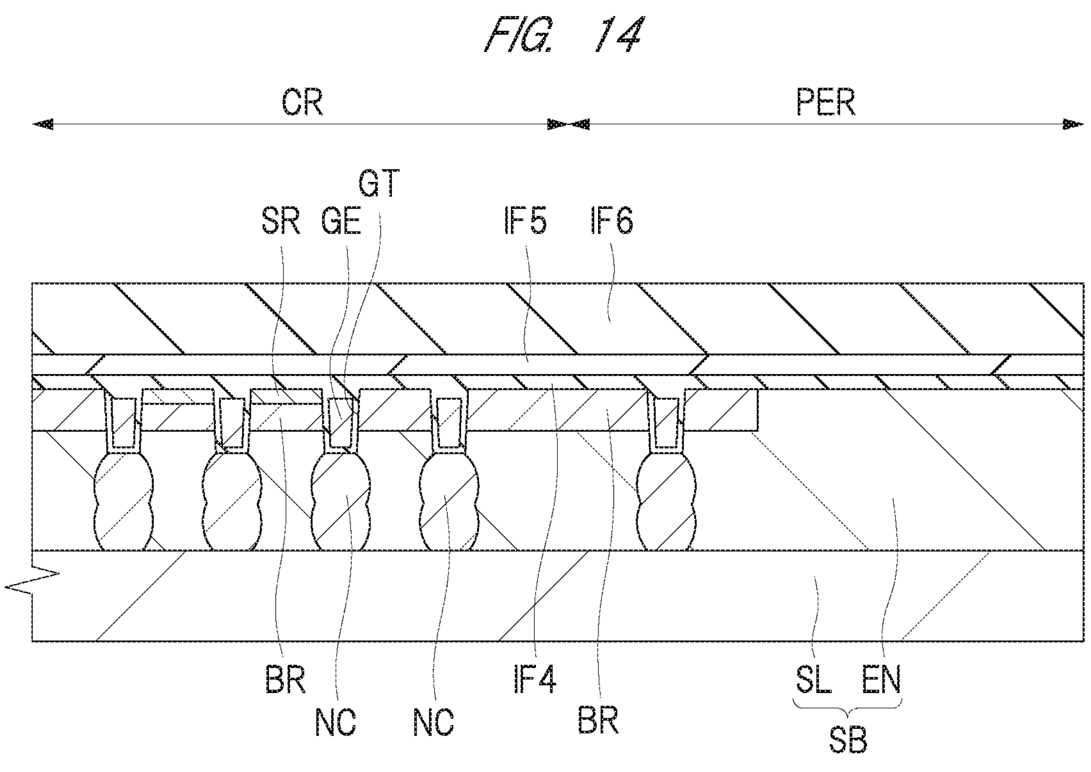
FIG. 14 is a cross-sectional view of a semiconductor device according to a second embodiment during a manufacturing process.

First, as shown in FIG. 14, the steps described with reference to FIGS. 1 to 7 are performed. However, in the process described with reference to FIG. 1, as a semiconductor wafer, a semiconductor substrate (stacked semiconductor substrate) SB having an n-type epitaxial layer EN is prepared on a $n^+$ type semiconductor layer SL. The resistor of the epitaxial layers EN is, for example, 0.13 mΩcm or less. The n-type impurity density of the epitaxial layers EN is, for example, $6.0\times10^{16}$ $cm^{-3}$.

Subsequently, the photoresist film PR3 is removed. Thereafter, an insulating film is formed on each of the epitaxial layer EP, the insulating film IF4, and the gate electrode GE using, for example, a CVD method. The insulating film is made of, for example, silicon oxide. In FIG. 14, the insulating film and the insulating film IF4 are integrally formed, and they are collectively shown as the insulating film IF4.

Next, insulating films IF5 and IF6 are sequentially formed on the insulating film IF4. The insulating film IF5 is made of, for example, silicon nitride. The insulating film IF6 is made of, for example, silicon oxide. The insulating films IF5 and IF6 can be formed by, for example, a CVD method. Subsequently, although not shown, a silicon-oxide film is formed on the insulating film IF6 by, for example, a CVD method.

Figure 15:
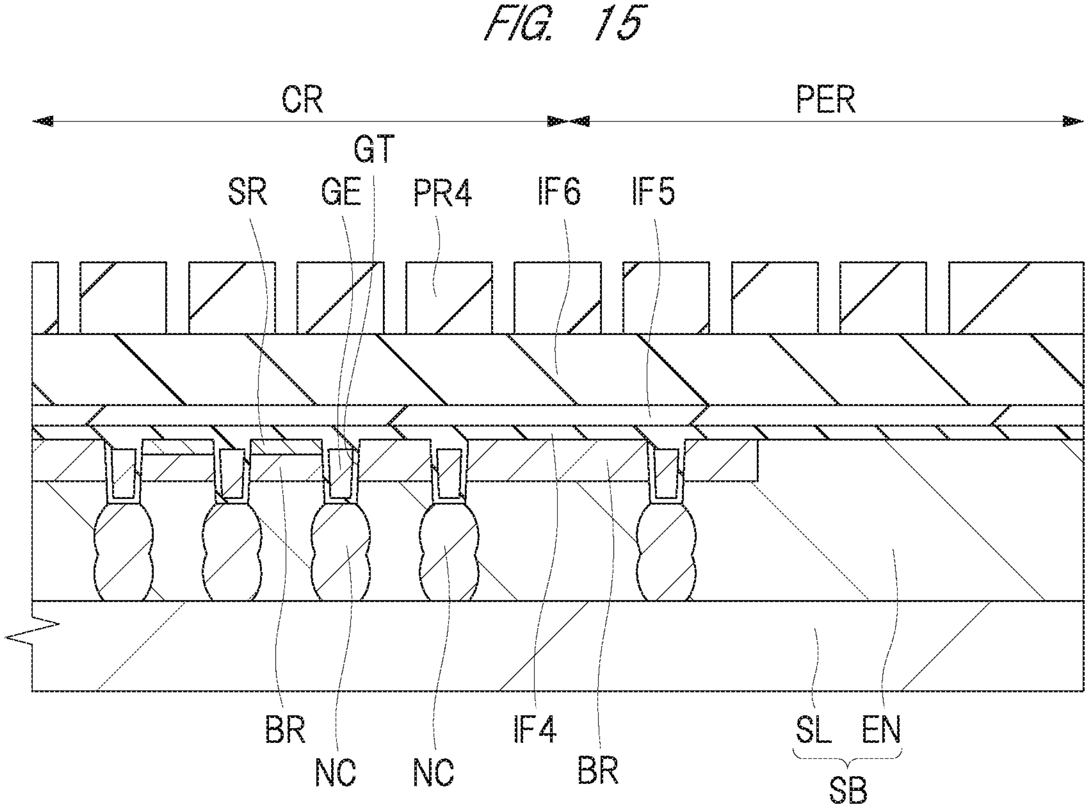
FIG. 15 is a cross-sectional view during the manufacturing process of the semiconductor device following FIG. 14.

Next, as shown in FIG. 15, a photoresist film PR4 is formed on the insulating film IF6. The photoresist film PR4 is a resist pattern having openings exposing the insulating film IF6 in each of the cell region CR and the peripheral region PER. In the cell region CR, the opening is located directly on the region between adjacent trenches GT.

Figure 16:
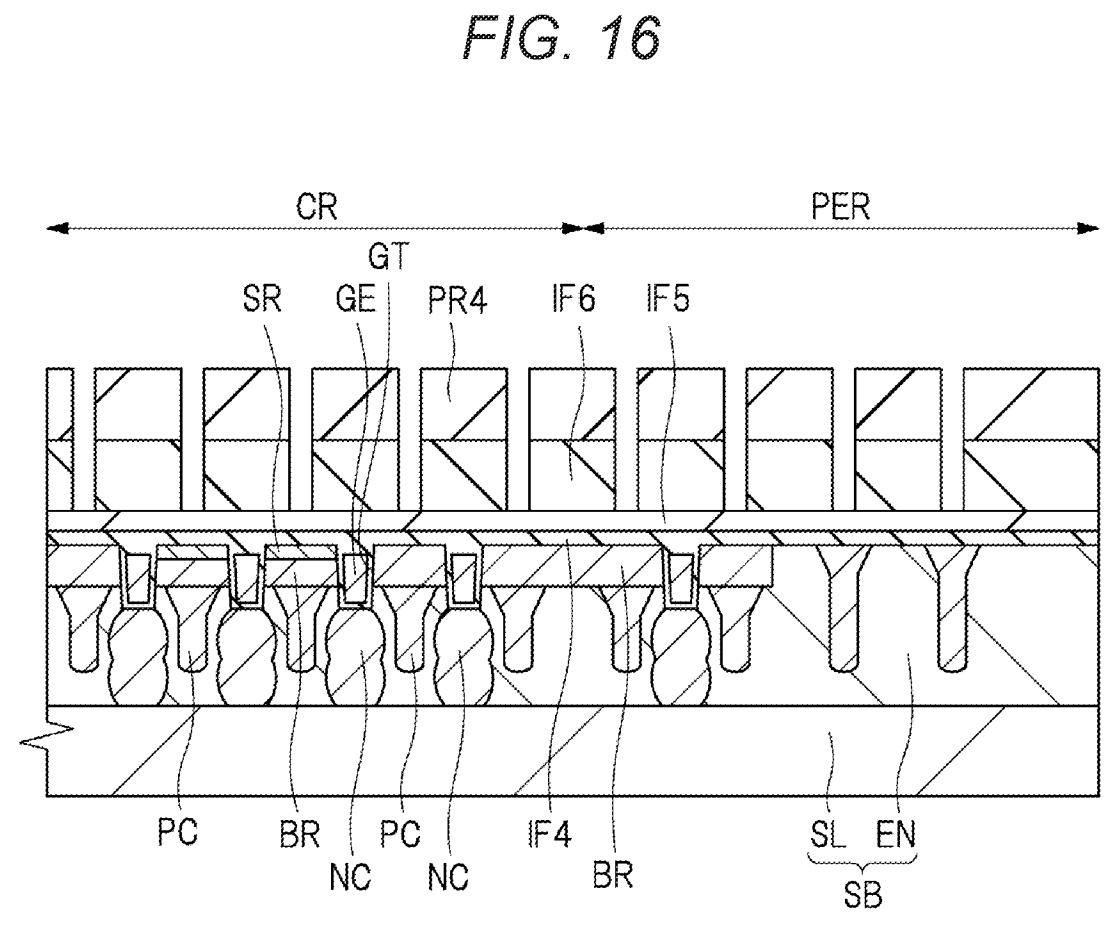

Next, as shown in FIG. 16, dry etching is performed using the photoresist film PR4 as a mask to form a plurality of openings that penetrate the insulating film IF6 and expose the upper surface of the insulating film IF5. Subsequently, ion-implantation is performed using the photoresist film PR4 as a mask. Here, a p-type impurity (for example, B (boron)) is implanted in the epitaxial layers EP. By introducing p-type impurities into the epitaxial layers EP in this manner, a p-type column PC, which is a p-type semiconductor-region, is formed between adjacent trenches GT. The p-type column PC is spaced apart from the trench GT in the X-direction along the upper surface of the epitaxial layer EN. That is, by introducing the p-type impurity into the epitaxial layers EN separated from the trench GT in the X direction, the p-type column PC adjacent to the n-type column NC in the X direction is formed.

Here, the p-type column PC is formed in the epitaxial layers EN from the lower surface of the body region BR to a position deeper than the trench GT. The p-type column PC does not reach the semiconducting layers SL. In other words, the p-type column PC and SL are separated from each other.

The p-type column PC is formed by, for example, two times of ion-implantation (multi-stage implantation) with different implantation energies. The dose of the respective implantation step is, for example, $2.5\times10^{13}$ $cm^{-2}$. The p-type impurity concentration of the p-type column PC is, for example, $2.5\times10^{18}$ $cm^{-3}$.

Next, although not shown, the photoresist film PR4, the insulating film IF6, and IF5 are removed. Subsequently, the step of forming the interlayer insulating film IL described with reference to FIG. 8 is performed.

Figure 17:
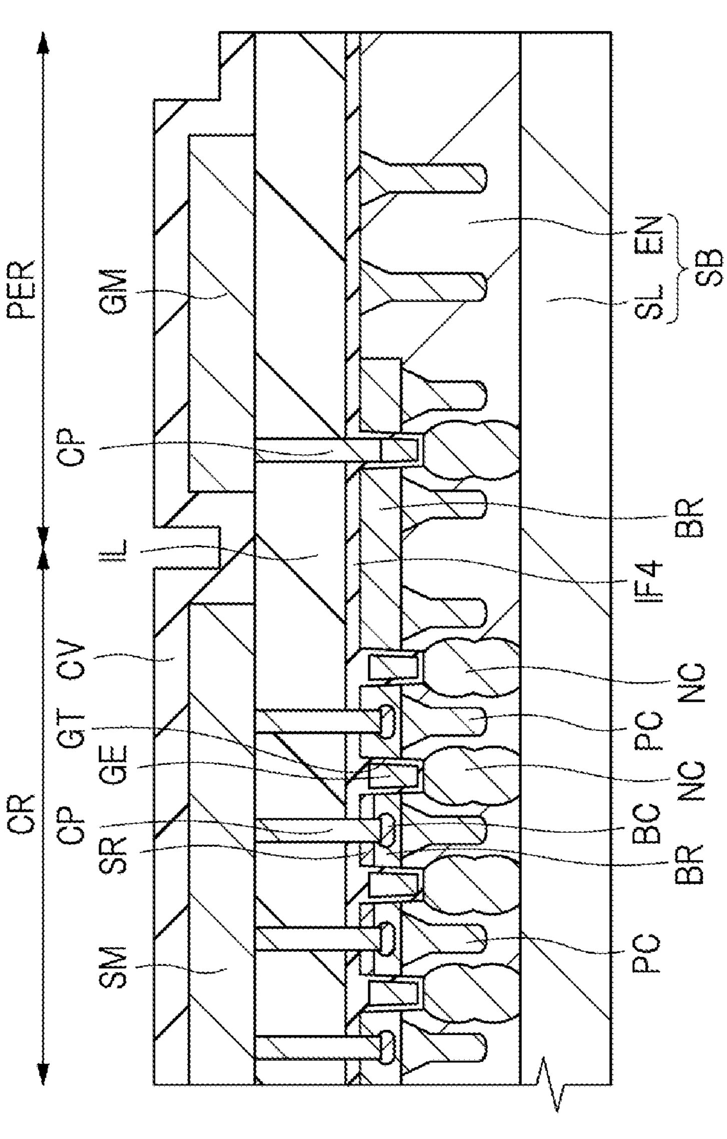
FIG. 17 is a cross-sectional view during the manufacturing process of the semiconductor device following FIG. 15.

Next, as shown in FIG. 17, the steps described with reference to FIGS. 9 to 12 are performed to complete the semiconductor device of the present embodiment.

Figure 18:
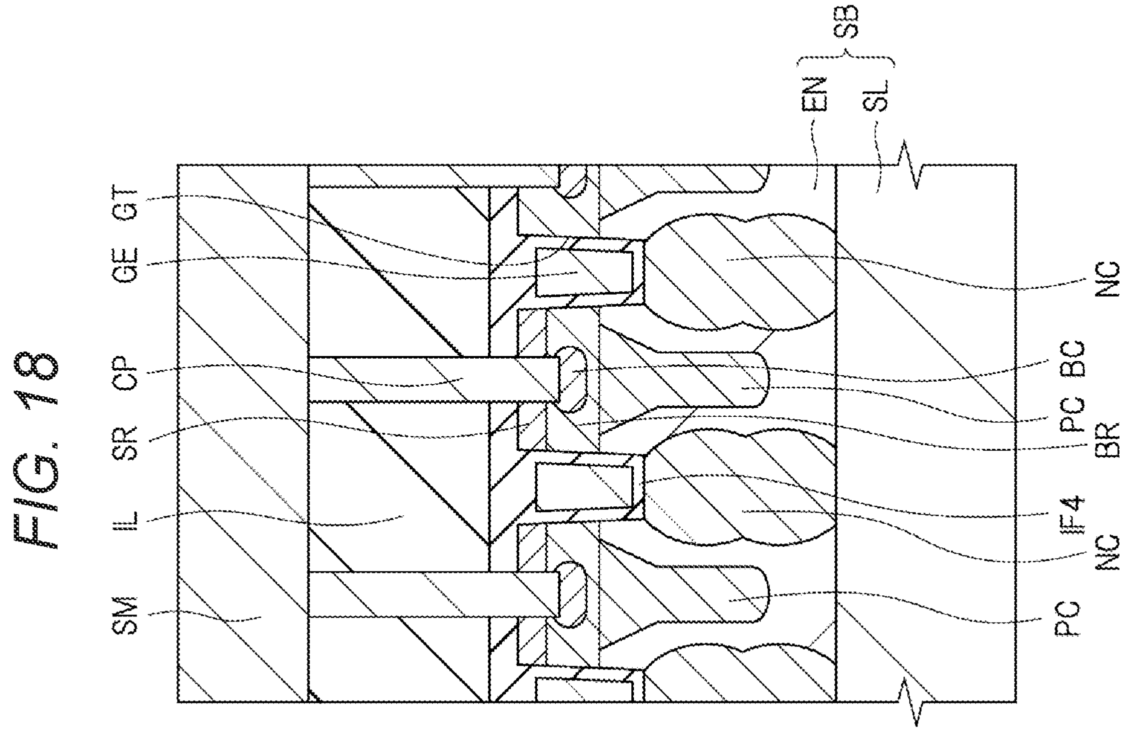
FIG. 18 is a cross-sectional view of a main part of the semiconductor device according to the second embodiment.

As shown in FIG. 18, the semiconductor device of the present embodiment is a vertical power MOSFET having a super junction structure in which a p-type column PC and an n-type column NC made of an n-type epitaxial layer EP are alternately arranged laterally. The device shown in FIG. 18 differs from the first embodiment in that the epitaxial layers EN are not p-type but n-type, and in that the epitaxial layers have p-type column PC below regions between adjacent trenches GT. The p-type column PC is formed in the epitaxial layer EN separated from the trench GT in the X direction along the upper surface of the epitaxial layer EN, and is adjacent to the n-type column NC in the X direction.

Even when the p-type column PC and the n-type column NC are formed in the n-type epitaxial layers EN by ion implantation as in the present embodiment, the same effects as those of the first embodiment can be obtained.

That is, here, the n-type column NC reaching semiconductor layer SL is formed by introducing an n-type impurity into the bottom portion directly under the trench GT. Therefore, it is possible to prevent the trench GT and the n-type column NC from being displaced from each other. As described above, by forming the n-type column NC at a desired position, it is possible to prevent a displacement between the trench GT and the p-type column PC. That is, even when the p-type impurity in the p-type column PC is largely diffused and the position where the p-type column PC is formed is close to the trench GT due to misalignment of lithography, the n-type column NC is present, so that the current path can be secured with a desired size.

Therefore, it is easy to increase the number of columns arranged per unit area while securing the breakdown voltage of the vertical power MOSFET. Accordingly, the ON resistance of the vertical power MOSFET can be reduced, and the performance of the semiconductor device can be improved.

Although the invention made by the present inventor has been specifically described based on the embodiment, the present invention is not limited to the as described above embodiment, and it is needless to say that various modifications can be made without departing from the gist thereof.

Further, in the above embodiment has been described a semiconductor device including a substrate made of Si (silicon) and epitaxial layers, but a semiconductor device made of SiC (silicon carbide) instead of Si may be used. In other words, the semiconductor substrate may be made of SiC.

In the above-described embodiment, an n-channel MOSFET is formed, but MOSFET may be a p-channel. When the p-channel type MOSFET is formed, each of the semiconductor regions constituting the semiconductor device described above may be formed with the opposite conductivity type.

What is claimed is:

1. A method of manufacturing a semiconductor device, the method comprising:

(a) preparing a semiconductor substrate having a first semiconductor layer of a first conductivity type and a second semiconductor layer of a second conductivity type formed on the first semiconductor layer, the second conductivity type being different from the first conductivity type;

(b) forming a gate trench having a predetermined width and reaching an intermediate depth from an upper surface of the second semiconductor layer by using an etching mask having a predetermined opening width;

(c) forming a first column of the first conductivity type in the second semiconductor layer by introducing an impurity of the first conductivity type into a bottom of the gate trench such that the first column reaches the first semiconductor layer; and (d) forming a body region of the second conductivity type and a source region of the first conductivity type in the second semiconductor layer at a side surface of the gate trench, wherein the introduction of the impurity of the first conductivity type in the (c) is performed by an ion implantation using the etching mask in the (b) defining an opening of the gate trench, and wherein the first column is separated from a bottom surface of the gate trench.

2. The method according to claim 1, wherein in the (b), a plurality of gate trenches including the gate trench is formed in the second semiconductor layer, and wherein a portion of the second semiconductor layer is formed between opposing side surfaces of two adjacent gate trenches.

3. A method of manufacturing a semiconductor device, the method comprising:

(a) preparing a semiconductor substrate having a first semiconductor layer of a first conductivity type and a second semiconductor layer of the first conductivity type formed on the first semiconductor layer;

(b) forming a gate trench having a predetermined width and reaching an intermediate depth from an upper surface of the second semiconductor layer by using an etching mask having a predetermined opening width;

(c) forming a first column of the first conductivity type in the second semiconductor layer by introducing an impurity of the first conductivity type into a bottom of the gate trench such that the first column reaches the first semiconductor layer;

(d) forming a body region of a second conductivity type and a source region of the first conductivity type in the second semiconductor layer at a side surface of the gate trench, the second conductivity type being different from the first conductivity type; and (e) forming a second column of the second conductivity type in the second semiconductor layer by introducing an impurity of the second conductivity type into the second semiconductor layer such that the second column is spaced from the gate trench and is adjacent to the first column in a first direction along an upper surface of the second semiconductor layer, wherein the introduction of the impurity of the first conductivity type in the (c) is performed by an ion implantation using the etching mask in the (b) defining an opening of the gate trench, and wherein the first column is separated from a bottom surface of the gate trench.

* * * * *